United States Patent [19]

Kryzaniwsky

[11] Patent Number: 5,227,338
[45] Date of Patent: Jul. 13, 1993

[54] THREE-DIMENSIONAL MEMORY CARD STRUCTURE WITH INTERNAL DIRECT CHIP ATTACHMENT

[75] Inventor: Bohdan R. Kryzaniwsky, Hopewell Junction, N.Y.

[73] Assignee: International Business Machines Corporation, Armonk, N.Y.

[21] Appl. No.: 793,778

[22] Filed: Nov. 18, 1991

Related U.S. Application Data

[63] Continuation of Ser. No. 516,504, Apr. 30, 1990, Pat. No. 5,099,309.

[51] Int. Cl.⁵ .................... H01L 21/28; H01L 21/56
[52] U.S. Cl. .................... 437/207; 437/208; 437/209; 437/211
[58] Field of Search .................. 357/80, 75, 81, 82, 357/74; 361/394, 385, 420; 437/206, 207, 208, 209, 211, 214, 217, 220

[56] References Cited

U.S. PATENT DOCUMENTS

| | | | |
|---|---|---|---|
| 4,612,083 | 9/1986 | Yasumoto et al. | 437/208 |
| 4,688,648 | 8/1988 | Sorel | 361/394 |
| 4,855,809 | 8/1989 | Malhi et al. | 437/209 |
| 4,862,249 | 8/1989 | Carlson | 357/75 |
| 4,874,721 | 10/1989 | Kimura et al. | 437/209 |
| 4,894,706 | 1/1990 | Sato et al. | 357/75 |
| 4,956,694 | 9/1990 | Eide et al. | 357/74 |
| 5,006,923 | 4/1991 | Warren | |
| 5,099,309 | 3/1992 | Kryzaninsky | 357/75 |

FOREIGN PATENT DOCUMENTS

| | | |
|---|---|---|
| 0073486 | 3/1983 | European Pat. Off. . |
| 0246744 | 3/1987 | European Pat. Off. . |
| 0334733 | 3/1989 | European Pat. Off. . |
| 0352050 | 9/1989 | European Pat. Off. . |
| 2077534 | 12/1981 | United Kingdom . |

OTHER PUBLICATIONS

IBM Technical Disclosure Bulletin, vol. 18, No. 10, Mar. 1976, K. C. Joshi et al, "High Density Bubble Memory Package" pp. 3184–3185.

Primary Examiner—Brian E. Hearn
Assistant Examiner—Kevin M. Picardat
Attorney, Agent, or Firm—Richard Lau

[57] ABSTRACT

Process for producing a card structure having an internal three-dimensional array of semiconductor chips includes providing a thermal conductor plane, applying a first compliant dielectric material on major surfaces of the thermal conductor plane, forming a two-dimensional array of chip wells in the dielectric material on each side of the thermal conductor plane, positioning and securing semiconductor chips in the chip wells, laminating a lead frame mounted on a carrier sheet over the first compliant dielectric material and the semiconductor chips, forming an electrical connection between each of the semiconductor chips and the lead frame, encapsulating the electrical connections with a filler, laminating an insulating layer and a wiring plane over the encapsulated connections, electrically connecting the lead frame and the wiring plane so as to form a chip core, and electrically connecting a power core to the chip core.

33 Claims, 8 Drawing Sheets

THREE-DIMENSIONAL MEMORY CARD STRUCTURE WITH INTERNAL DIRECT CHIP ATTACHMENT

RELATED U.S. APPLICATION DATA

This is a continuation application of application Ser. No. 07/516,504, filed Apr. 30, 1990, and issued as U.S. Pat. No. 5,099,309 on Mar. 24, 1992.

BACKGROUND OF THE INVENTION

1. Field of the Invention

The present invention generally relates to high density, high speed transistor memory chip packaging and more particularly, to a card structure containing within itself a three dimensional configuration of memory chips.

2. Description of the Related Art

High speed signal transmission between computer system components is becoming increasingly important as machine cycle times are pushed toward ever shorter values. Excessive lead lengths between circuit units introduces high lead inductance which impacts data transmission speed. In the case of conventional semiconductor memory packaging, for example, memory chips are placed in memory modules which, in turn, are mounted on memory cards. Such three-level packaging introduces signal path length delays which are likely to become unacceptable in upcoming high speed machines. To take full advantage of the high speed signals generated at the chip level, the chip input-output (I/O) pad to card structure signal line distance must be made as short as possible.

In U.S. Pat. No. 4,849,284, issued on Jul. 18, 1989 to David J. Arthur et al. for Electric Substrate Material, a ceramic filled fluoropolymer-based electrical substrate material is proposed for forming printed wiring boards for surface-mounted integrated circuit chips. The substrate material is said to enable board characteristics including low signal propagation delay. Increased chip density at the board level is not addressed, however.

U.S. Pat. No. 4,635,356, issued on Jan. 13, 1987 to Masayuki Ohuchi et al. for Method of Manufacturing A Circuit Module discloses a method for potting discrete resistors, capacitors and transistor devices into a multilayered module configuration. The supporting module structure for the potted devices is the cured potting resin itself. Although the described technique provides some measure of increased discrete device density, the materials used and the resulting structure are not aimed at solving the aforementioned problem of high density, high speed transistor memory chip packaging and its impact on high speed machine cycle time.

SUMMARY OF THE INVENTION

One object of the present invention is to provide a high density, high speed memory package characterized by minimal signal delay from memory chip to memory card structure.

Another object is to provide a memory card structure containing internally a three dimensional configuration of memory chips.

A further object is to provide a memory card structure having an internal three dimensional array of memory chips and characterized by maximum density, compatible thermal coefficients of expansion and ample heat dissipation.

In accordance with the present invention, dynamic random access memory (DRAM) chips or static RAM (SRAM) chips are placed directly within a multi-level memory card structure to eliminate the use of any intervening modules. The chips are positioned inside the card structure prior to the lamination of the signal and power layers to the card structure structure. To maintain thermal expansion stability between the chips and laminated card structure materials, a preferred embodiment of the present invention employs a glass-filled fluoropolymer-based material, commonly termed poly-tetra-fluoroethylene or PTFE. PTFE advantageously possesses a compliant nature, a thermal coefficient of expansion (TCE) approximately one half that of prior art epoxy glass dielectrics, a characteristic impedance about one third that of epoxy glass and a low dielectric constant, causing only a low signal propagation delay. The direct attachment of the memory chips within the card structure structure provides high operational speed and substantially increased chip density at the card structure level. Provision also is made for signal and power distribution between chips along vertical as well as horizontal planes internal to the card structure and for the cooling of the card structure. Memory control logic chips may be placed on the surface of the card structure.

DESCRIPTION OF THE PREFERRED EMBODIMENTS

Figures 1A, 1B:
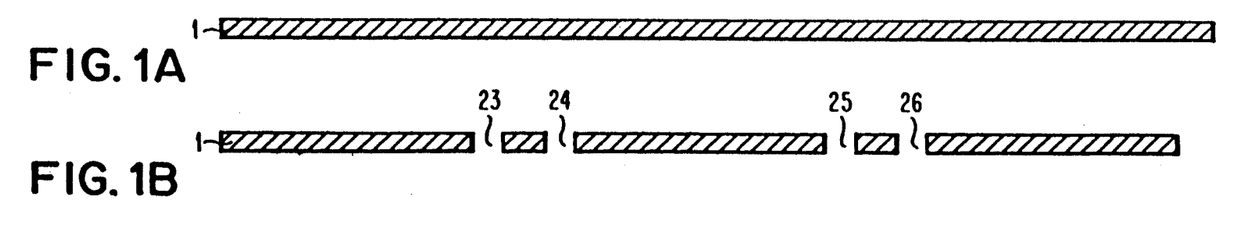
FIG. 1 is a series of simplified cross-sectional views of the chip core portion of a memory card structure constructed in accordance with the present invention as it would appear at successive times during fabrication.
Figure 1C:
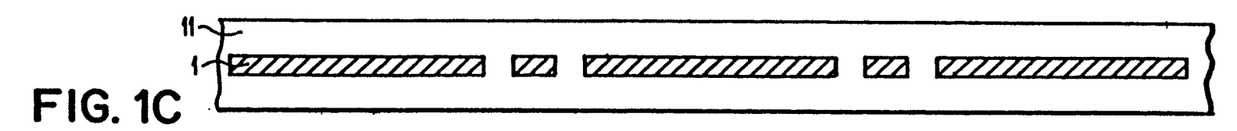
Figure 1D:
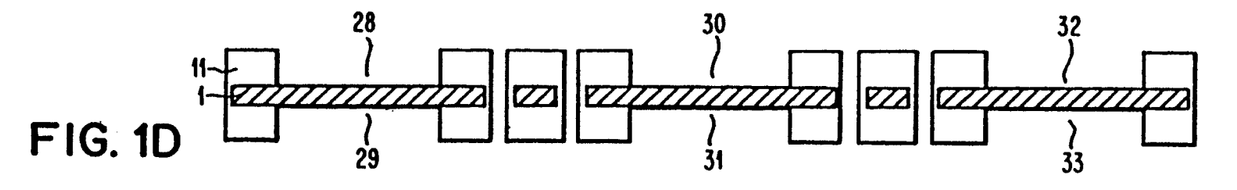
Figure 1E:
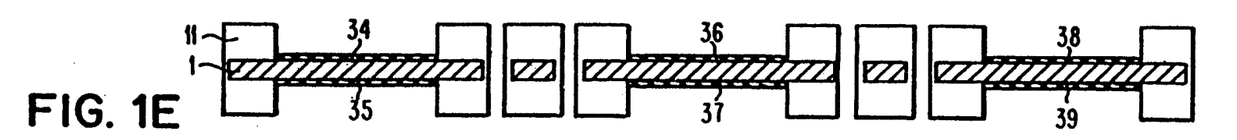
Figure 1F:
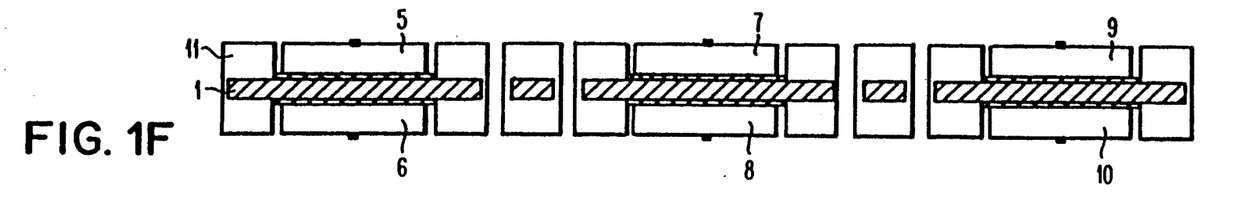
Figure 1G:
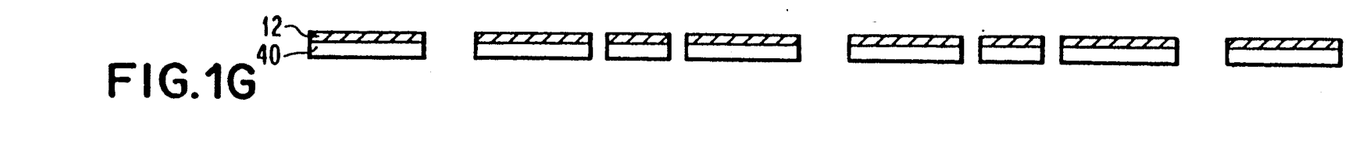
Figure 1H:
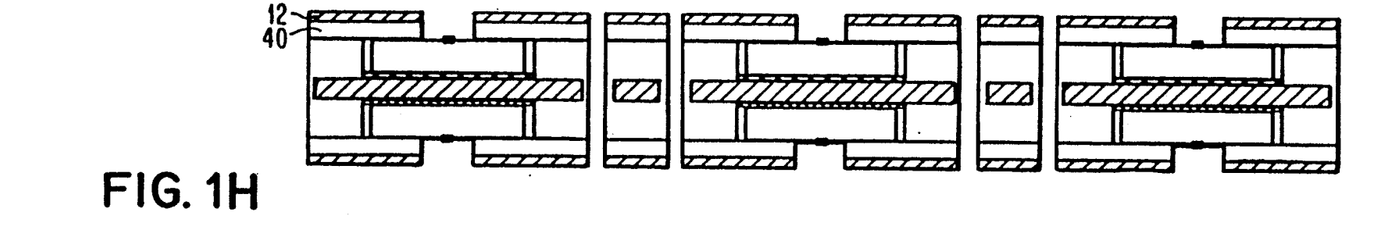
Figure 1I:
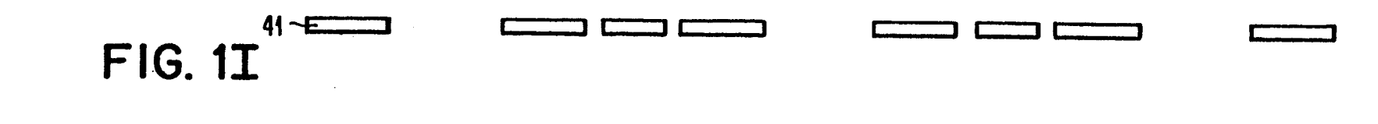
Figure 1J:
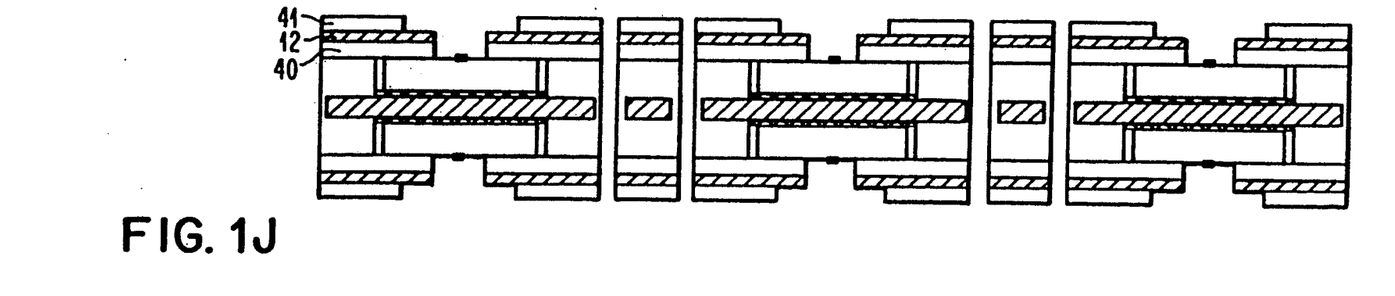
Figure 1K:
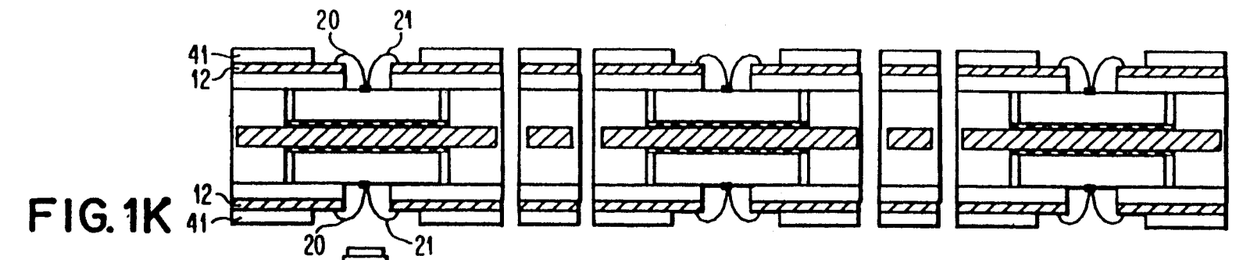
Figure 1L:
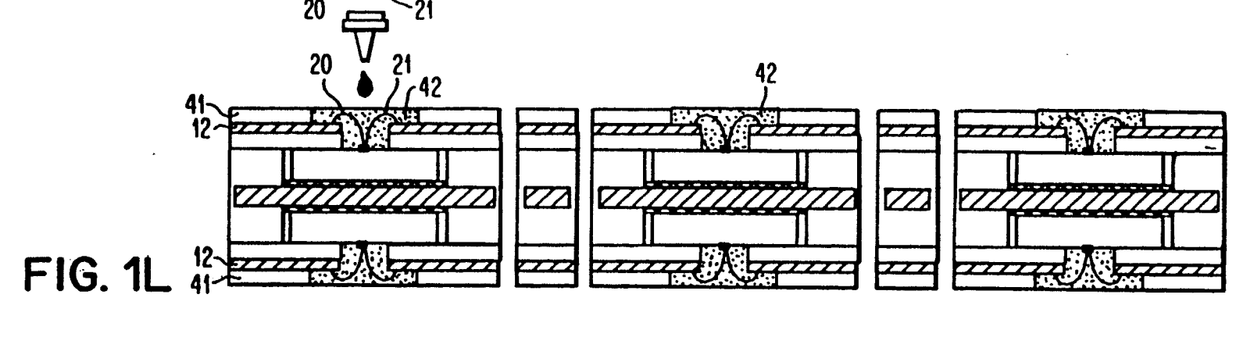
Figure 1M:
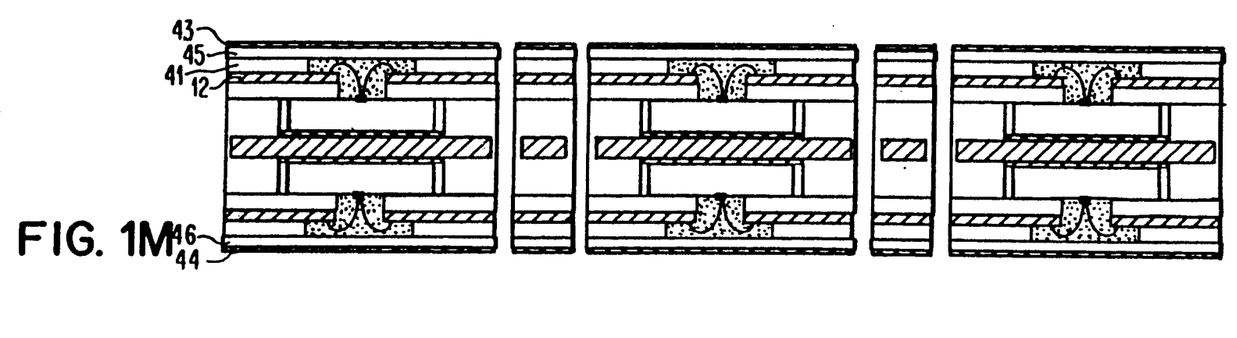
Figure 1N:
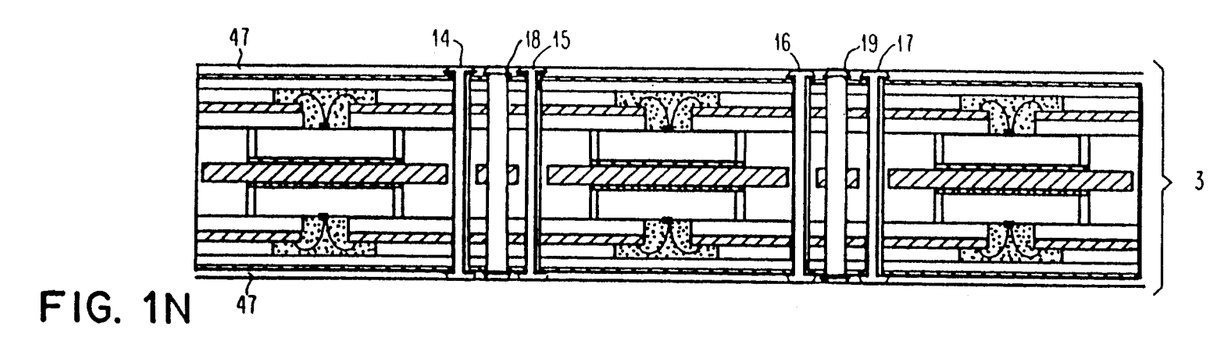
Figure 2:
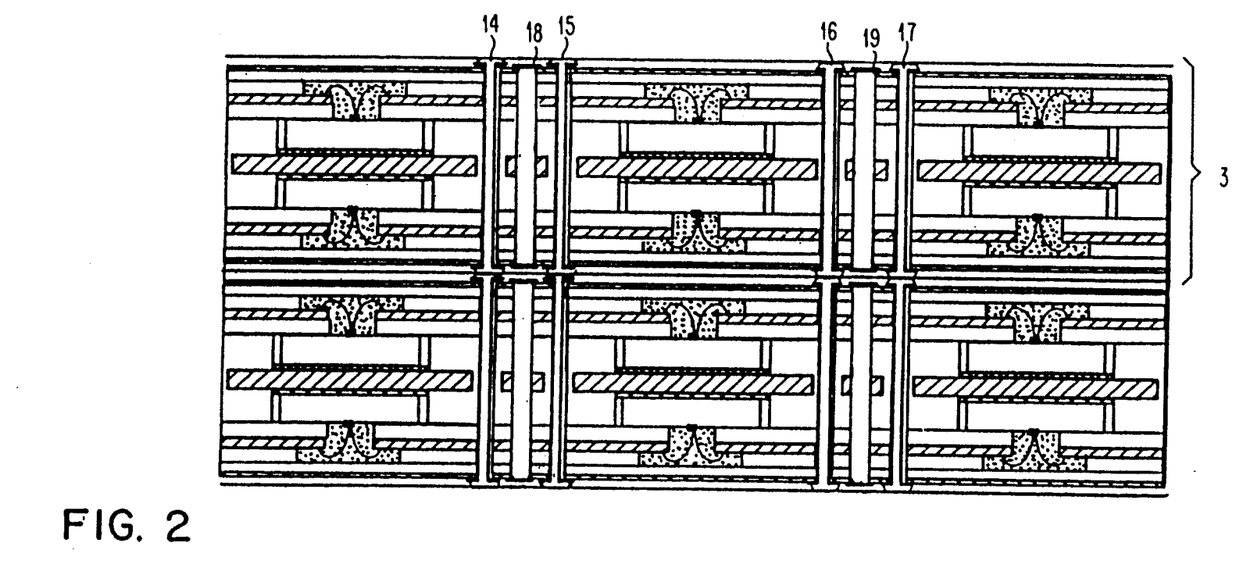
FIG. 2 is a cross-sectional view of two completed chip core portions joined together.
Figure 3:
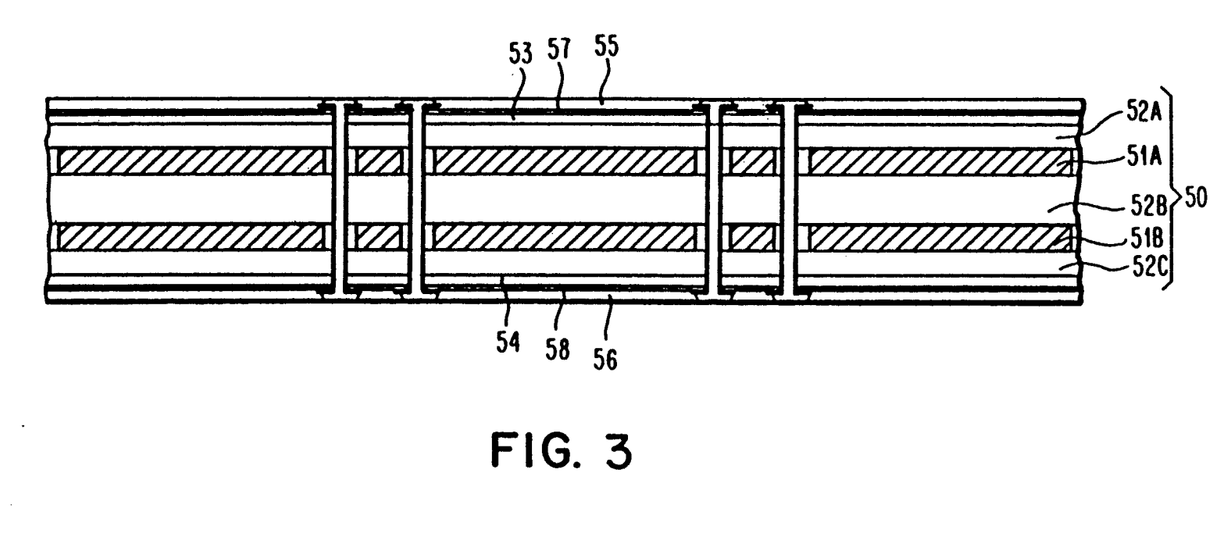
FIG. 3 is a cross-sectional view of the power core portion of the memory card structure of the present invention.
Figure 4:
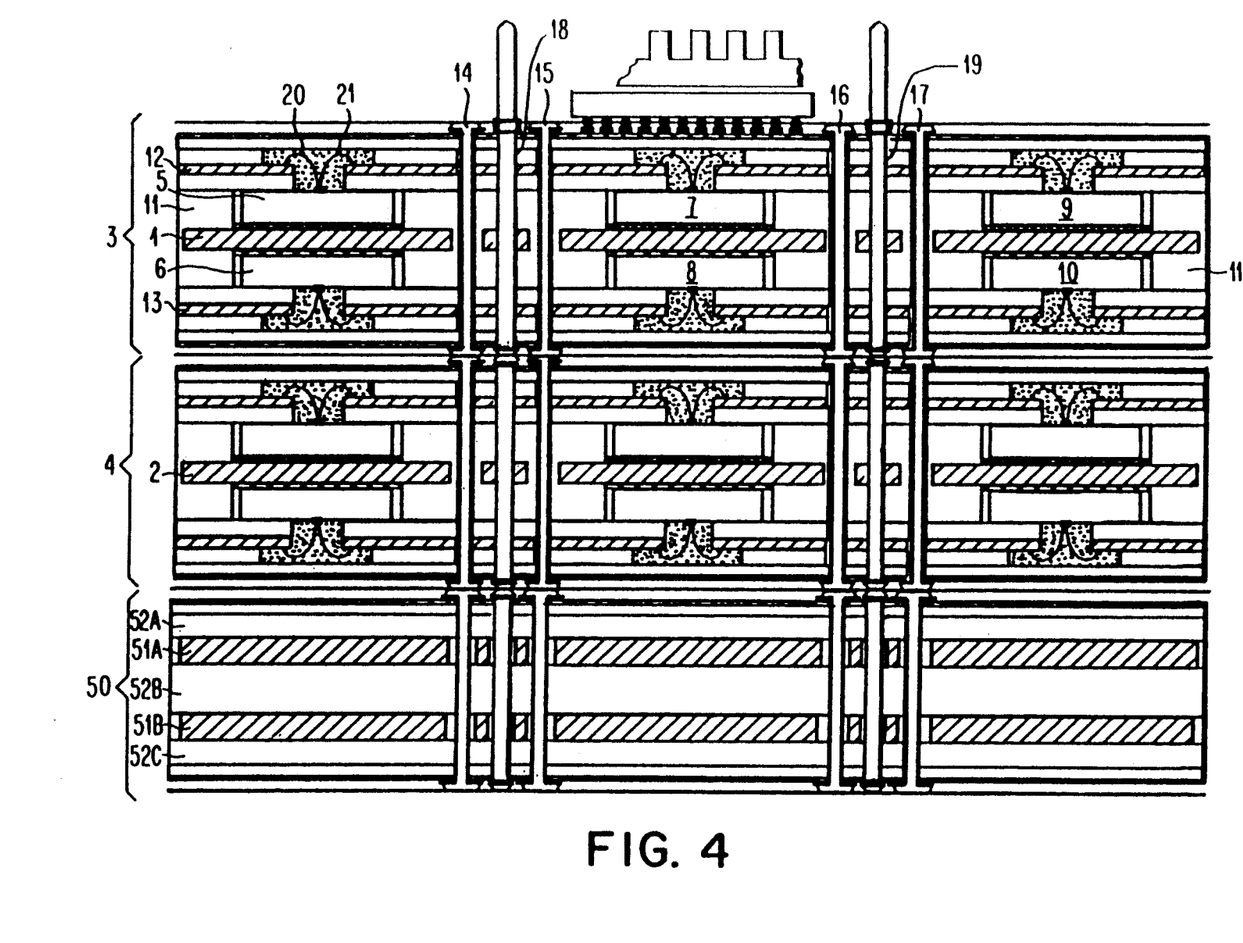
FIG. 4 is a cross-sectional view of one total memory card structure embodiment of the present invention including the chip core portions and power core portions of FIGS. 2 and 3, respectively.
Figure 5:
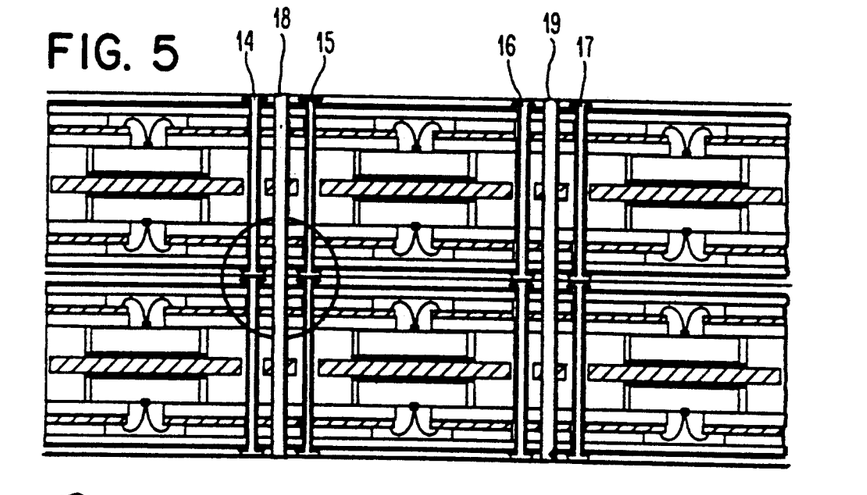
FIG. 5 is a partially exploded cross-sectional view of an alternative scheme for joining the chip core portions of FIG. 2.

Referring briefly to FIG. 4, a completed memory card structure, constructed in accordance with the present invention, will first be outlined before considering the detailed steps associated with FIGS. 1-3 by which the completed card structure is fabricated. Said card structure basically includes thermal conductor planes 2 in respective chip cores 3 and 4, memory chips (such as chips 5-10, inclusive, of core 3) in each of chip cores 3 and 4, dielectric layers (such as layers 11 of core 3) in each of chip cores 3 and 4, lead frames (such as lead frames 12 and 13 of core 3) in each of chip cores 3 and 4, together with plated-through-vias (such as vias 14, 15, 16 and 17 of core 3) and cooling vias 18 and 19.

Electrical contact is established with the embedded chips using appropriate plated vias and connected lead frame portions which are wire bonded (such as by wires 20 and 21 of core 3) to chip pads. The thermal conductor planes (such as plane 1 of core 3) make contact with cooling vias 18 and 19 to remove heat generated within the memory chips. Each of the dielectric layers 11 preferably comprises polytetrafluoroethylene (PTFE) material in order to exploit the attributes thereof including its compliant nature, low TCE, low characteristic impedance and low dielectric constant which translate into the desirable memory card structure characteristics of thermal expansion stability and reduced signal propagation delay.

The memory card structure of FIG. 4 further comprises power core portion 50 which employs the same material (preferably a copper-invar-copper alloy) for power busses 51 as is used in the chip cores 3 and 4 for the thermal conductor planes 1 and 2. The power busses are insulated by the same PTFE material 52 as is used for the dielectric layers such as layer 11 of core 3. Thus, the same benefit of thermal expansion stability is realized for power core 50 as for chip cores 3 and 4 due to the use of the same materials. Vias 14–17 and cooling vias 18 and 19 also penetrate power core 50.

Referring now to FIG. 1A, the steps for fabricating chip cores 3 and 4 will be described. For the sake of clarity, the same reference numerals of FIG. 4 will be used for the corresponding items of FIG. 1. Each chip core contains a thermal conductor plane (preferably copper-inver-copper) such as plane 1. Plane 1 also serves as a major structural support member for the core and is apertured at locations 23–26 of FIG. 2B to provide for vias 14–17 of FIG. 4. Dielectric material 11, preferably PTFE because of its compliant nature and the other desirable properties discussed previously, is applied to both sides of the apertured conductor plane 1 as shown in FIG. 2C.

Chip wells 28–33 of FIG. 1D are formed by chemical or mechanical means in dielectric material 11 to provide sites for the placement of chips 5–10 of FIG. 4. Double-sided thermally conductive dielectric tape segments 34–37 of FIG. 1E are positioned in wells 28–33 to secure memory chips 5–10 as shown in FIG. 1F.

The punched copper lead frame 12 of FIG. 1G is mounted on drilled PTFE carrier sheet 40 and is laminated over the chip core structure of FIG. 1H. Frame 12 contains fan-out circuitry for accessing memory chip circuit nodes. A drilled dielectric sheet 41 of FIG. 1I serves as a dam for an encapsulating material. The dam 41 material is laminated to both sides of the structure of FIG. 1H as illustrated in FIG. 1J. Wire bonds such as 20 and 21 of FIG. 1K join chip nodes to respective lead frame conductors and are encapsulated with an epoxy fill 42 of FIG. 1L on both sides of the chip core. When all of the wire bond wells are encapsulated front and back circuit wiring planes 43 and 44 of FIG. 1M are added over respective insulating layers 45 and 46 and are laminated to the structure.

The chip core is completed by circuit personalization metallization, i.e., holes (not shown) are formed in insulating layers 41 and 45 to permit the connection of lead frame 12 to the wiring plane 43 as desired (on both side of the chip core); vias 14–17 are plated as shown in FIG. 1N to provide electrical continuity between the wiring planes of the chip core; holes are drilled and filled with, for example, solder, copper or other metal to form cooling vias 18 and 19 which contact the thermal conductor planes 1 and 2; and a protective coating 47 is applied to both surfaces of the chip core. In the embodiment of FIG. 4, it will be noted that solid cooling vias are provided but for higher power dissipation applications, the plated holes may be replaced by hollow holes adapted for water cooling. Appropriate heat exchanges (not shown) are connected to the ends of the cooling vias.

The chip cor 3 is joined to one or more chip cores as in FIG. 2 by thermal-compression bonding, conductive polymers or other means using the pads at the ends of the plated vias 14–17 and at the ends of the cooling vias 18, 19. The power core of FIG. 3, comprising laminated electrically conductive layers 51A and 51B, dielectric layers 52A–C and 53–56 and circuit wiring planes 57 and 58, also is joined as in FIG. 4 to the chip cores to complete the memory card structure. Preferably, layers 52A, 52B and 52C comprise PTFE and layers 51A and 51B comprise copper-invar-copper. Logic drivers and interfacing circuits to and from the system can be directly mounted on either or both major surfaces of the card structure.

Figure 6:
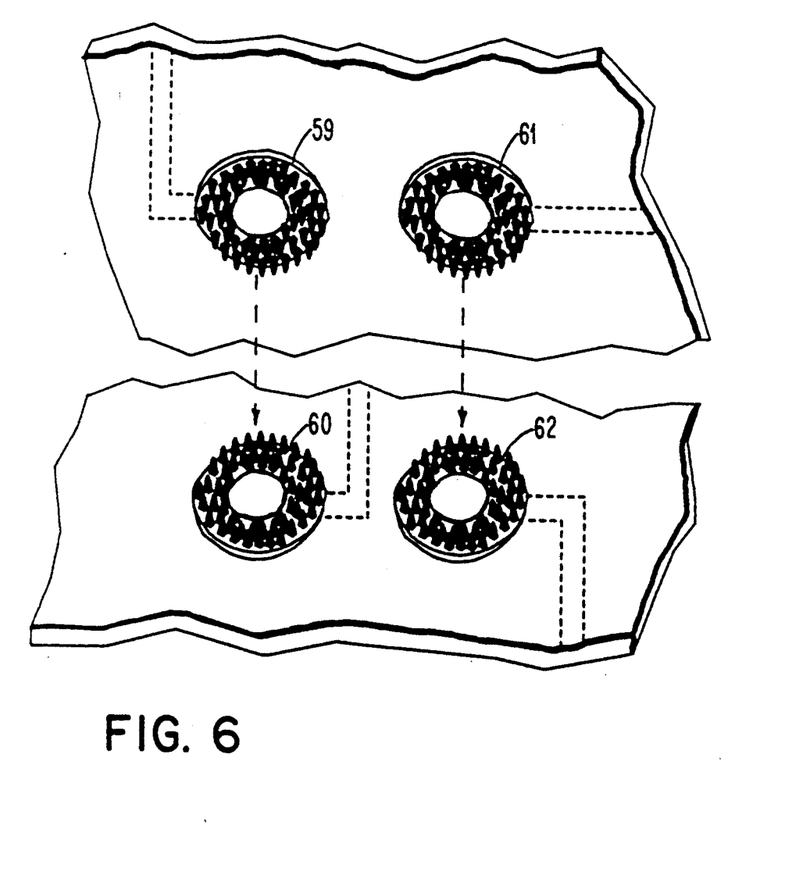
FIG. 6 is a perspective view of an alternative construction for the power planes of FIG. 1D.

Instead of permanently joining the cores to each other by thermal-compression bonding or the like in the described manner, the detachable joint of FIG. 6 may be substituted to permit rework or replacement of chip cores containing unacceptable numbers of defective chips. Mechanical pressure joints consisting of mating pads 59 and 60 and pads 61 and 62 are placed on respective facing ends of vias 14–17 and cooling vias 18 and 19. The pads mesh together under applied pressure to form a solid electrical or thermal contact.

Figure 7:
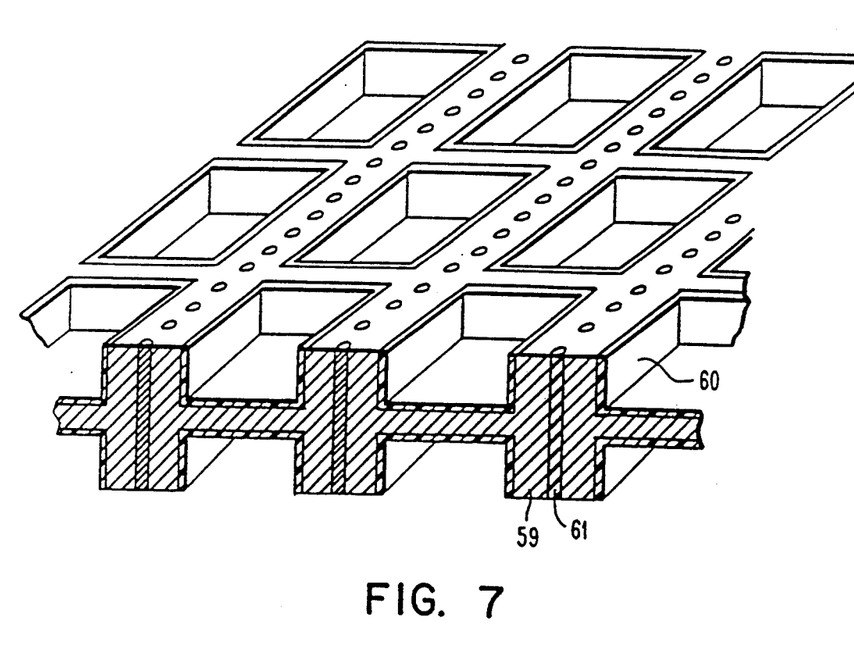

FIG. 7 shows a preformed molybdenum thermal conductor 59, lined with PTFE 60 along the interior vertical surfaces, that may be substituted for the structure of FIG. 1D in the fabrication process of FIGS. 1E–1N. The walls of conductor 59 surround and protect the memory chips (to be placed therein) from any inadvertent damage during the thermal compression bonding steps of the memory card structure fabrication process. Additionally, the use of molybdenum enhances the thermal conduction capacity of conductor 59 relative to that of the copper-invar-copper conductor 1 previously described. The holes 61 in conductor 59 require insulating linings so that they can be plated and used as signal or power vias.

It should be noted that additional chip cores may be mounted on either side of power core 20 of FIG. 4, depending upon thermal requirements and the allowable total card structure thickness in a given memory design situation.

What is claimed is:

1. A process for producing a card structure having an internal three dimensional array of semiconductor chips, comprising:

providing a thermal conductor plane;

applying a first compliant dielectric material on major surfaces of said thermal conductor plane, said first compliant dielectric material having a low dielectric constant and further having a thermal coefficient of expansion compatible with the thermal coefficient of expansion of said semiconductor chips and said thermal conductor plane, whereby thermal expansion stability with said semiconductor chips and said thermal conductor plane is maintained;

forming a two dimensional array of chip wells in said dielectric material on each side of said thermal conductor plane;

positioning and securing said semiconductor chips in respective ones of said chip wells;

laminating a lead frame mounted on a carrier sheet over said first compliant dielectric material and said semiconductor chips;

forming an electrical connection between each of said semiconductor chips and said lead frame;

encapsulating said electrical connections with a filler;

laminating an insulating layer and a wiring plane over said encapsulated connections;

electrically connecting said lead frame and said wiring plane so as to form a chip core; and electrically connecting a power core to said chip core, said power core comprising:

at least one electrical conductor plane; and a second compliant dielectric material on the major surfaces of said electrical conductor plane, said second compliant dielectric material having a thermal coefficient of expansion compatible with said electrical conductor plane, whereby thermal expansion stability with said electrical conductor plane is maintained.

2. A process for producing a card structure according to claim 1, wherein said thermal conductor plane and said electrical conductor plane comprise the same conductive material.

3. A process for producing a card structure according to claim 2, wherein said same conductive material comprises copper-invar-copper.

4. A process for producing a card structure according to claim 1, wherein said first compliant dielectric material and said second compliant dielectric material comprise the same dielectric material.

5. A process for producing a card structure according to claim 4, wherein said same dielectric material comprises polytetrafluoroethylene.

6. A process for producing a card structure according to claim 1, further including the step of providing conductor means for electrically connecting said card structure to another device.

7. A process for producing a card structure according to claim 6, wherein said step of providing conductor means, comprises:

forming an aperture through said chip core and said power core;

filling said aperture with a conductive via, which is insulated from said thermal conductor plane and said electrical conductor plane.

8. A process for producing a card structure according to claim 7, wherein said conductive via includes an end which comprises metallic dendrite pads for connecting with other metallic dendrite pads.

9. A process for producing a card structure according to claim 1, further including the step of providing cooling means for cooling said card structure.

10. A process for producing a card structure according to claim 9, wherein said step of providing cooling means comprises:

forming an aperture through said chip core;

filling said aperture with a cooling via containing material thermally contacting said thermal conductor plane and said electrical conductor plane.

11. A process for producing a card structure according to claim 1, wherein said thermal conductor plane is shaped so as to surround the sides of each said semiconductor chip.

12. A process for producing a card structure according to claim 11, wherein said thermal conductor plane comprises molybdenum.

13. A process for producing a chip core according to claim 11, wherein said thermal conductor plane and said electrical conductor plane comprise the same conductive material.

14. A process for producing a chip core according to claim 13, wherein said same conductive material comprises copper-invar-copper.

15. A process for producing a chip core according to claim 11, wherein said first compliant dielectric material and said second compliant dielectric material comprise the same dielectric material.

16. A process for producing a chip core according to claim 15, wherein said same dielectric material comprises polytetrafluoroethylene.

17. A process for producing a chip core according to claim 11, further including the step of providing conductor means for electrically connecting said chip core and/or said power core to another device.

18. A process for producing a chip core according to claim 17, wherein said step of providing conductor means, comprises:

forming an aperture through said chip core and said power core;

filling said aperture with a conductive via, which is insulated from said thermal conductor plane and said electrical conductor plane.

19. A process for producing a chip core according to claim 18, wherein said conductive via includes an end which comprises metallic dendrite pads for connecting with other metallic dendrite pads.

20. A process for producing a chip core according to claim 11, further including the step of providing cooling means for cooling said chip core and said power core.

21. A process for producing a chip core according to claim 20, wherein said step of providing cooling means comprises:

forming an aperture through said chip core and said power core;

filling said aperture with a cooling via containing material thermally contacting said thermal conductor plane and said electrical conductor plane.

22. A process for producing a card structure having an internal three dimensional array of semiconductor chips, comprising:

providing a thermal conductor plane;

applying a first compliant dielectric material to said thermal conductor plane, said first compliant dielectric material having a low dielectric constant and further having a thermal coefficient of expansion compatible with the thermal coefficient of expansion of said semiconductor chips and said thermal conductor plane, whereby thermal expansion stability with said semiconductor chips and said thermal conductor plane is maintained;

forming chip wells in said dielectric material;

positioning and securing said semiconductor chips in respective ones of said chip wells;

laminating a lead frame mounted on a carrier sheet over said first compliant dielectric material and said semiconductor chips;

forming an electrical connection between each of said semiconductor chips and said lead frame;

encapsulating said electrical connections with a filler;

laminating an insulating layer and a wiring plane over said encapsulated connections;

electrically connecting said lead frame and said wiring plane so as to form a chip core; and electrically connecting a power core to said chip core, said power core comprising:

at least one electrical conductor plane; and a second compliant dielectric material on the major surfaces of said electrical conductor plane, said second compliant dielectric material having a thermal coefficient of expansion compatible with said electrical conductor plane, whereby thermal expansion stability with said electrical conductor plane is maintaine.

23. A process for producing a card structure according to claim 22, wherein said thermal conductor plane and said electrical conductor plane comprise the same conductive material.

24. A process for producing a card structure according to claim 23, wherein said same conductive material comprises copper-invar-copper.

25. A process for producing a card structure according to claim 22, wherein said first compliant dielectric material and said second compliant dielectric material comprise the same dielectric material.

26. A process for producing a card structure according to claim 25, wherein said same dielectric material comprises polytetrafluoroethylene.

27. A process for producing a card structure according to claim 22, further including the step of providing conductor means for electrically connecting said card structure to another device.

28. A process for producing a card structure according to claim 27, wherein said step of providing conductor means, comprises:

forming an aperture through said chip core and said power core;

filling said aperture with a conductive via, which is insulated from said thermal conductor plane and said electrical conductor plane.

29. A process for producing a card structure according to claim 28, wherein said conductive via includes an end which comprises metallic dendrite pads for connecting with other metallic dendrite pads.

30. A process for producing a card structure according to claim 22, further including the step of providing cooling means for cooling said card structure.

31. A process for producing a card structure according to claim 3, wherein said step of providing cooling means comprises:

forming an aperture through said chip core;

filling said aperture with a cooling via containing material thermally contacting said thermal conductor plane and said electrical conductor plane.

32. A process for producing a card structure according to claim 22, wherein said thermal conductor plane is shaped so as to surround the sides of each said semiconductor chip.

33. A process for producing a card structure according to claim 32, wherein said thermal conductor plane comprises molybdenum.

* * * * *